United States Patent [19]

Faulkner, Jr.

[11] Patent Number: 4,513,382

[45] Date of Patent: Apr. 23, 1985

[54] ELECTRIC UTILITY AUTOMATED DISTRIBUTION APPARATUS WITH IMPROVED DATA DISPLAY

[75] Inventor: James V. Faulkner, Jr., Raleigh, N.C.

[73] Assignee: Westinghouse Electric Corp., Pittsburgh, Pa.

[21] Appl. No.: 408,957

[22] Filed: Aug. 17, 1982

[51] Int. Cl.³ .................. H04B 7/00; H04B 3/54; H04Q 9/00
[52] U.S. Cl. .................. 364/492; 364/514; 364/521; 340/825.06
[58] Field of Search ........... 364/521, 514, 483, 492, 364/493; 340/825.06, 825.07, 310 R, 310 A, 717; 358/139

[56] References Cited

U.S. PATENT DOCUMENTS

| | | | |
|---|---|---|---|
| 3,696,392 | 10/1972 | Fosum et al. | 340/717 |
| 3,812,488 | 5/1974 | Yoshino et al. | 364/521 X |
| 3,999,093 | 12/1976 | Kirtley, Jr. | 310/198 |
| 4,075,620 | 2/1978 | Passavant et al. | 364/521 X |
| 4,080,568 | 3/1978 | Funk | 364/483 X |
| 4,135,182 | 1/1979 | Bell et al. | 340/717 X |
| 4,146,923 | 3/1979 | Borkan | 364/483 |
| 4,153,936 | 5/1979 | Schmitz et al. | 364/493 |
| 4,199,761 | 4/1980 | Whyte et al. | 340/695 |
| 4,216,384 | 8/1980 | Hurley | 307/39 |
| 4,234,926 | 11/1980 | Wallace et al. | 364/131 |
| 4,264,960 | 4/1981 | Gurr | 364/514 X |
| 4,279,012 | 7/1981 | Beckedorff et al. | 340/309.4 X |
| 4,283,772 | 8/1981 | Johnston | 364/900 |
| 4,291,376 | 9/1981 | McCahill | 364/483 |
| 4,332,980 | 6/1982 | Reynolds et al. | 340/870.02 X |
| 4,386,436 | 5/1983 | Kocher et al. | 340/310 A X |
| 4,419,665 | 12/1983 | Gurr et al. | 340/825.06 |

Primary Examiner—Edward J. Wise
Attorney, Agent, or Firm—William D. Lanyi

[57] ABSTRACT

A load management terminal for an electric utility automated distribution system includes a receiver for receiving central commands sent from an electric utility central station by power line carrier signals. A control unit is connected to the receiver for executing the commands such as load shedding and remote metering. The terminal includes means for generating data at the remote site representative of the results of the executed commands and for storing the status data in a memory device. A video signal generator converts the status data into a composite video signal which is supplied to a modulator to produce a standard RF television signal. The terminal is selectively connected to the television receiver of an electric utility customer, whereby the metering and load shed status data is displayed on the customer television receiver.

17 Claims, 9 Drawing Figures

```
METER=-----KWH    COST=$--,---HR
CONSUMPTION(KWH) SINCE LAST BILL
 BASE=------      PEAK=------
 SHOULDER=------  TOTAL=------
              BILLING
DUE DATE --/--/--  KWH=------
FROM --/--/--      TO --/--/--
AMT DUE $----..--  PAST $----..--
            LOAD CONTROL
LOAD        STATUS  TIME TO RESET
WATER HTR   ---      --MIN
PUMP        ---      --MIN
AC          ---      --MIN
AUX         ---      --MIN
```

ELECTRIC UTILITY AUTOMATED DISTRIBUTION APPARATUS WITH IMPROVED DATA DISPLAY

BACKGROUND OF THE INVENTION

The invention relates generally to electric utility automated distribution apparatus for remotely reading meters, controlling customer loads, and operating distribution equipment; and, more particularly, to a remote terminal including improved capability for display of data processed by the terminal.

Electric utility companies are increasingly turning to automated distribution systems in their continuing efforts to increase reliability and control the cost of supplying electrical energy to their many residential and industrial customers. Such systems are used to remotely read customer's meters from a central location and to remotely control distribution equipment, as well as to effect remote load shedding during periods of peak energy usage. A variety of communications media can be employed in such systems. For example, systems using power line carrier signals to communicate between a central electric utility location and remote terminals are described in U.S. Pat. No. 4,130,874 issued Dec. 19, 1978 to Stephen M. Pai and U.S. Pat. No. 4,467,314 which issued on Aug. 21, 1984 to Weikel, et al. The aforementioned Patents are each assigned to the assignee of the present invention. Initial setup and testing of the remote terminals in these systems is performed by a field configuration terminal also described in the aforementioned patent application, with required display data being provided by a plurality of numeric and alphanumeric multisegment display devices and indicator lights. Although such a field configuration terminal provides generally satisfactory service, the usefulness of display information is limited by the lack of meaningful labels associated with the output of the multi-segment display devices. The amount of data provided and the flexibility to provide additional data for new terminal functions is similarly limited.

Repair of defective remote terminals is seldom attempted in the field, but is generally relegated to a well equipped factory repair shop having access to a multitude of sophisticated test equipment. It is often necessary to employ oscilloscopes, specialized test boxes with indicators, logic analyzers, a central station for generating test commands, and specialized computer controlled test devices such as a Hewlett Packard type 3060 automatic tester. Such testing generally requires considerable disassembly of the unit which may entail compromising the environmental protection originally manufactured into the unit. For example, use of the 3060 test device requires removal of the conformal coating, that is, the sealant material sprayed onto circuit boards to prevent short circuits and corrosion problems which may be produced by dust and humidity.

Although automated distribution systems are increasingly used to transmit data for remote metering and billing to the electric utility central station, the information heretofore supplied by such system to the customer relating to his consumption of electrical energy was minimal. Electromechanical meters utilizing a pulse initiator and a traditional dial-type register, for example, have supplied only a totalized reading of kilowatt hours. However, such dials were often difficult for the customer to read, thus restricting the usability of even this limited data. Electronic multi-function registers employing alphanumeric displays can provide additional quantities of information, but the lack of meaningful labels has sometimes been the source of customer confusion.

Energy monitors for use at customer locations are available as outboard units to provide additional energy consumption data. However, such devices may require rather complex installation procedures and may produce various discrepancies between the data displayed thereon and the data actually used by the electric utility in preparation of the customer's bill if they are not associated with the customer's meter. Available energy monitors also have the previously mentioned disadvantages of providing a limited amount of data in a format which may be subject to misinterpretation.

In view of the foregoing, it would be desirable to provide apparatus for use with an electric utility automated distribution system having the capability to provide an increased amount of easily interpreted data to facilitate field testing and setup, simplify factory repair and testing, and to enable an electric utility customer to make meaningful decisions regarding his consumption of electrical energy.

SUMMARY OF THE INVENTION

In accordance with the present invention, apparatus is provided for use in an electric utility automated distribution system employing communication signals carrying control commands relating to the consumption of electric energy at a customer location. The apparatus includes a receiver coupled to the power line for receiving communication signals and for deriving the control commands generated by an electric utility central station. A control unit is connected to the receiver for executing control functions such as meter reading and load shedding in response to the transmitted commands. Means are provided to generate status data relating to the consumption of energy at the customer location, such as the status (either connected or disconnected) of water heaters, air conditioners and other interruptible loads which are subject to load shed commands at peak hours. Other status data may include information relating to the amount of electrical energy consumed at the customer's location, produced by various types of watthour meters operating either a pulse initiator or an encoding register to provide signals representative of the amount of electrical energy consumed.

The apparatus also includes a memory device for storing the status data in a digital form. Storage of this data in the memory device along with fixed format data labeling the varying status data is executed under control of the control unit.

The status data, in digital form, is supplied from the memory device to a display generator which generates composite video signals corresponding to the alphanumeric or graphical representation of the digital signals applied at its input. These video signals are then supplied to a video display device. The display device may be included in the remote terminal or, alternatively, may be incorporated into a field configuration terminal removably connected to the remote terminal to aid in initial field setup and subsequent field testing.

In yet another alternative embodiment, the apparatus may include a modulator connected to the output of the display generator to provide a standard radio frequency television signal which may be connected to the input of a customer's television receiver. The customer then has access to a large amount of data relating to his consumption of electrical energy, including the connective status of his interruptible loads, the rate at which electrical energy is currently being consumed at his location, his total usage of electrical energy, and a variety of billing data related to the cost of electrical energy provided to his location. Accordingly, the present invention uniquely provides apparatus capable of displaying a large amount of locally generated data to meet a variety of data display requirements for automated distribution systems.

BRIEF DESCRIPTION OF THE DRAWINGS

The invention may be more completely understood by considering the following detailed description, in connection with the accompanying drawings, in which.

DETAILED DESCRIPTION OF THE DRAWINGS

Figure 1:
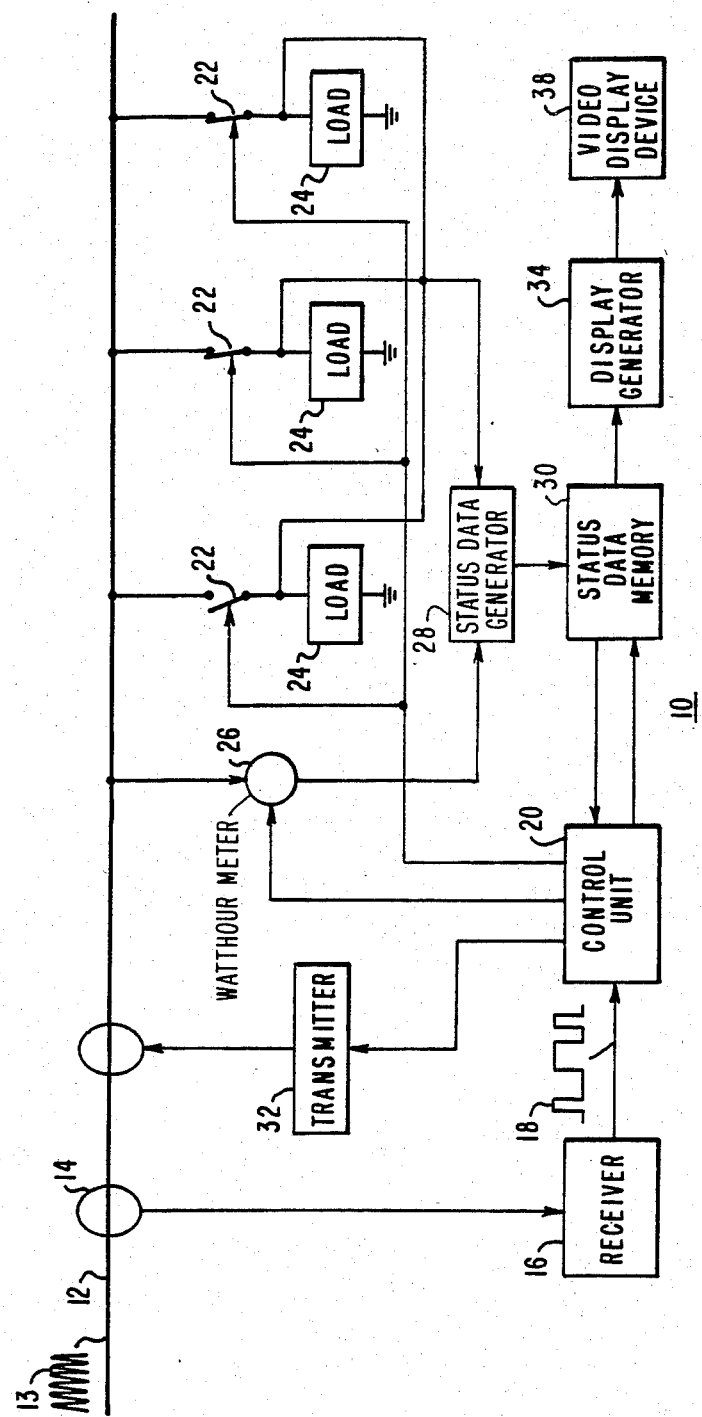
FIG. 1 is a functional block diagram of electric utility automated distribution apparatus incorporating the present invention.

Referring now to the drawings, and more particularly to FIG. 1, a block diagram illustrates a remote terminal 10 for use in an electric utility automated distribution system. The terminal 10 is coupled to an electric utility power line 12 and communicates with a central station, not shown, over the power line 12 by carrier signals 13 imposed thereon at a frequency higher than the power frequency. Although the invention is discussed in terms of an automated distribution system utilizing the power line as the communication medium, the invention is not so limited and may be used with automated distribution systems employing other communications media such as direct radio channels and the SCA subchannel associated with commercial broadcasting stations.

A coupler 14 is provided to couple the carrier signals 13 from the power line 12 to a receiver 16. The carrier signals may, for example, have a frequency of 12.5 kHz and have automated distribution commands modulated thereon by a coherent phase shift keying process as is described in U.S. Pat. No. 4,311,964 issued Jan. 19, 1982 to John R. Boykin and assigned to the assignee of the present invention. The receiver 16 derives the baseband data signals 18 imposed on the carrier signals at the electric utility's central station, by a demodulation process such as is discussed in the aforementioned U.S. Pat. No. 4,311,964.

Baseband data signals 18 are then applied to a control unit 20 which decodes the messages contained in the baseband data 18 to derive automated distribution commands such as load shedding and remote metering imposed at the electric utility central station. The control unit may then operate load control contacts 22 to energize or deenergize a plurality of loads 24, such as water heaters, air conditioners, and space heaters. Remote metering commands may be executed by the control unit 20 in conjunction with a watthour meter 26.

Results of the automated distribution commands executed by the control unit 20 are supplied to a status data generator 28 by the devices 22 and 26 affected by the automated distribution commands. These results are then transformed by the status data generator 28 into digital quantities for storage in a status memory 30. The status generator 28 may comprise, for example, contact closure inputs, a pulse initiator, or an encoding meter register. Data transmitted to the terminal 10 by the electric utility central station may be also supplied to the status memory 30 directly through the control unit 20.

Status data generated at the site of the terminal 10 may be returned to the electric utility central station by operation of a transmitter 32 operating in response to commands of the control unit 20. Operation of the transmitter 32 is described in the aforementioned U.S. Pat. Nos. 4,130,874 and 4,467,314.

The output of the status memory 30 is connected to the input of a display generator 34 which transforms the digital quantities stored in the status memory 30 into composite video signals. Fixed format data may also be supplied to the display generator 34 by a format memory 62 to provide fixed alphanumeric labels for the status data from the status memory 30 which may be constantly changing in response to commands received from the electric utility's central station and to changing conditions at the location of the terminal 10.

Composite video signals produced by the display generator 34 are then transmitted to a video display device 38 such as a video monitor employing a cathode ray tube. Other types of video display devices may, of course, be used, such as solid-state units which convert a composite video signal into a visual alphanumeric or graphic display on a display screen. The alphanumeric and graphic representations of the status data stored in the status memory 30 and the format data from the format memory 62 then appear on the screen of the video display device 38, presenting an operator or electric utility customer with a convenient, easily interpreted display of data generated at the location of the remote terminal 10.

Figure 2:
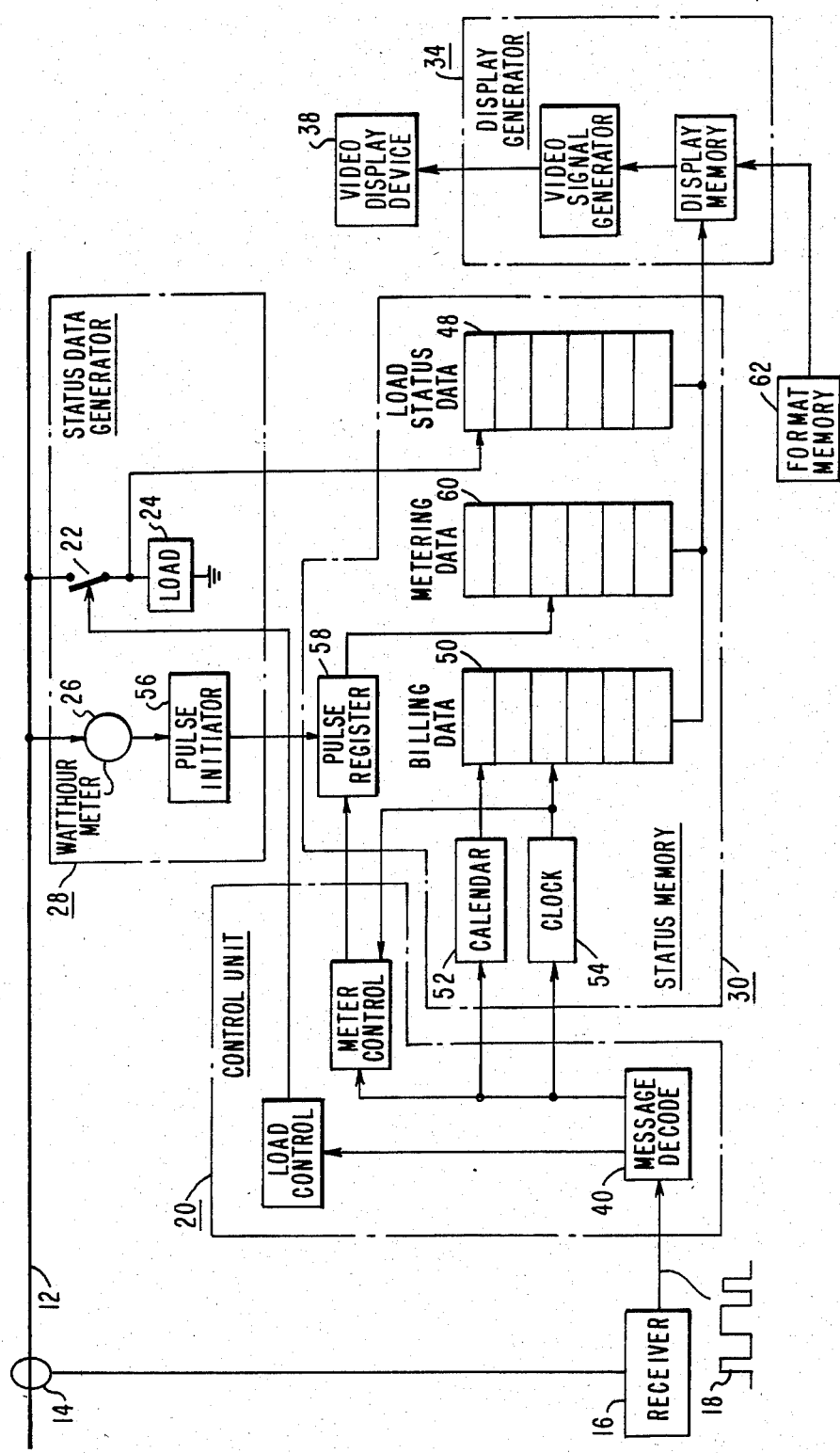
FIG. 2 is a more detailed functional schematic diagram, of a portion of the apparatus shown in FIG. 1.

Referring now to FIG. 2, a portion of the terminal 10 is shown in greater detail. Binary coded command messages represented by baseband digital data 18 derived from the carrier signals 13 are supplied to a message decode device 40 in the control unit 20. The format of these messages may be as described in the aforementioned U.S. Pat. No. 4,130,874; accordingly, the description of these message formats in this patent is specifically incorporated herein by reference.

The contents of the message data 18 may include commands to shed or restore an interruptible load in accordance with an overall load shedding program of the utility. The load shed commands are processed by the message decode device 40 and supplied to a load control device 21 to operate contacts 22, thereby energizing or de-energizing the electrical load 24. Although only a single load control device 21, set of contacts 22, and load 24 are shown in FIG. 2, it is to be understood that a plurality of such devices may be provided.

Each set of contacts 22 may include a load status line 46 supplying digital data specifying the connective status of the load 24 to a load status table 48. Alternatively, the message decode device 40 may store the commanded connective status directly in the load status table 48. The status table 48 is part of the status memory 30.

The message data 18 received from the electric utility central station may also include billing information, such as a change from a peak rate schedule to a shoulder or off-peak rate schedule. In other words, the cost of each kilowatt hour electrical energy may be changed. This information is derived by the message decode device 40 and supplied to a billing data table 50. Other information such as whether special holiday rate schedules are in effect may also be supplied to the billing data table 50 by a calendar register 52 and a clock register 54. As is shown in FIG. 2, the calendar and clock registers may be updated by data derived by the message decode device 40 from incoming automated distribution command messages.

The meter 26 may be a conventional electromechanical watthour meter driving a pulse initiator 56. As is well known in the art, rotations of the disc of such electromechanical watthour meters generate a train of pulses, each of which represents the consumption of a specified quantum of electrical energy. The pulses of the pulse initiator 56 are collected in a pulse register 58 and are periodically supplied to a metering data table 60. The clock register 54 and message decoder 40 provide inputs to the pulse register 58 to reset the register 58 and/or cause it to transfer its contents to the metering data table 60. The plurality of entries in the metering data table 60 represent the contents of the pulse register 58 over varying periods of time. As can be seen, the contents of the metering data table 60 are also part of the status memory 30.

In a preferred embodiment of the invention, the contents of the status memory 30 consist of 8-bit bytes of digital data. As will be described hereinafter, this data is converted to alphanumeric characters coded according to the American Standard Code for Information Interchange (ASCII) and arranged to provide a video display of 16 lines of 32 columns of alphanumeric characters or equivalent graphic data.

The status data accumulated in the status memory is transferred to specific locations in a 512 location block of a display memory 64 of the display generator 34. Each individual memory address in the block of display memory 64 corresponds to a specific character location in the array of 16 lines of 32 columns which appears on the screen of the video display device 38. Thus, a quantity of digital data transferred from the status memory 30 to a specific location in the display memory 64 will appear in one specific location on the screen of the video display device.

In order to make this information more meaningful to the viewer of the display device 38, fixed formats providing labels for the variable status data are contained in a format memory 62. The format memory 62 contains digital values corresponding to alphanumeric characters which are supplied to specific address locations of the display memory 64 to provide meaningful labels for the variable data supplied by the load status register 48, the billing data table 50, and the metering data table 60.

The contents of the display memory 64 are processed by a video signal generator 66 which transforms the digital quantities stored in the display memory 64 into a standard baseband composite video signal for presentation as a visual display of the alphanumeric representations of the data from the display memory 64 on the screen of a video display device 68.

Figures 3, 7:
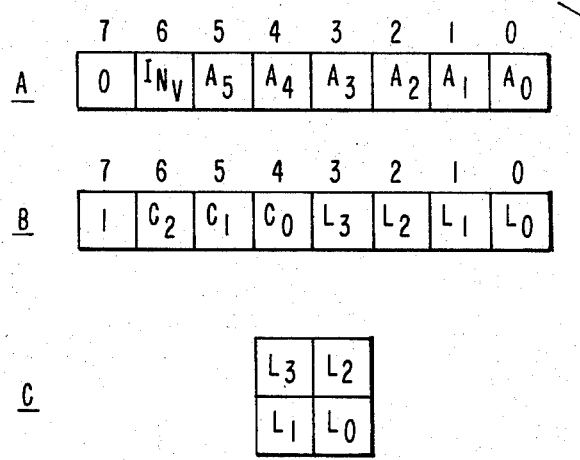
FIG. 3 is a view showing format data displayed on the screen of the video display device of FIGS. 1 and 2.
FIG. 7 shows the structure of digital data stored in the display memory of FIG. 5.

A representative display of the output of the screen of the video display device 68 is shown in FIG. 3. The alphanumeric characters shown therein represent format data derived from the format memory 62. The blank spaces shown in FIG. 3 represent locations for display of variable data from the load status register 48, the billing data table 50, and the metering data table 60. For example, line 1 of the display shown in FIG. 3 will provide the customer with a readout of the current kilowatt hour reading of his watthour meter, and the billing schedule currently in effect in cents/kilowatt hour. Line 2 of the display shown in FIG. 3 is a title line labeling four quantities which appear in the next two lines below, namely the number of kilowatt hours consumed in the current billing period at the base, peak, and shoulder periods respectively, as well as the total kilowatt hours consumed in the current billing period. Next on the display shown in FIG. 3 is information relating to the customer's actual bill including the due date, the total kilowatt hours from the previous billing period, the dates defining the previous billing period (from/to), and the dollar amount owed the utility including the amount currently due and the amount past due. Finally, the display of FIG. 3 shows the status of the various interruptible loads and the time remaining until a deenergized load will be reconnected and available for use.

Figure 4:
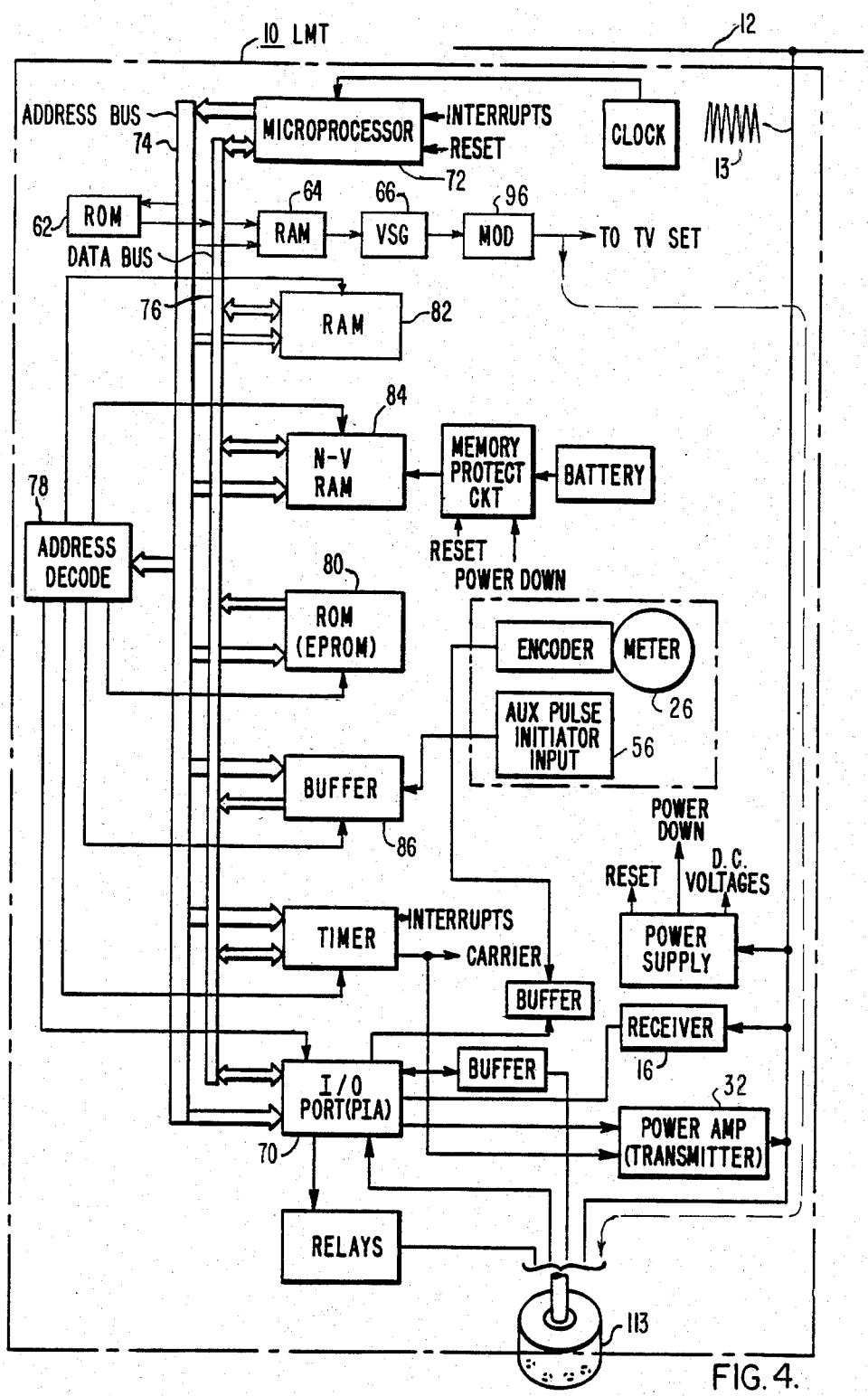
FIG. 4 is a structural block diagram of a load management terminal incorporating the present invention.

A block diagram of a preferred embodiment of the present invention is shown in FIG. 4, wherein a load management terminal for an automated distribution system provides a radio frequency video signal displayable on an electric utility customer's home TV set. The terminal shown in FIG. 4 includes all components of the load management terminal described in the aforementioned U.S. patent application Ser. No. 363,218, (W.E. 50,362). Accordingly, only a brief description of the circuitry so described will be provided herein. Additional components provided in the embodiment of the invention will be described in greater detail.

As can be seen in FIG. 4, the carrier signals 13 from the electric utility power line 12 are supplied through the receiver 16 to a programmable interface adapter (PIA) 70 functioning as an input/output port for a microprocessor 72. The microprocessor 72 may be a Motorola type SC44125T similar to the well-known type 6801. The PIA 70 is connected to the microprocessor 72 by an 11-bit address bus 74 and an 8-bit data bus 76. The functions of the control unit 20 of FIGS. 1 and 2 are provided by the microprocessor 72 in conjunction with an address decode device 78. The operating instructions of the microprocessor 72 are contained in a read only memory, specifically the erasable programmable read only memory 80 connected to the microprocessor 72 by the address bus and data bus 74 and 76, respectively. The status memory 30 including the load status register 48, billing data table 50, calendar register 52, clock register 54, pulse register 58, and metering data table 60 is embodied in random access memory 82 and non-volatile random access memory 84, similarly connected to the microprocessor 72 by the address and data busses 74 and 76, respectively. The pulse register 58 is supplied by the pulse initiator 56 through a buffer device 86. The relay contacts 22 are operated by the load control 21 embodied in the PIA 70 under control of the microprocessor 72. Format memory 62 is a read only memory device connected to the microprocessor 72 through the address and data busses 74 and 76, respectively.

Figure 5:
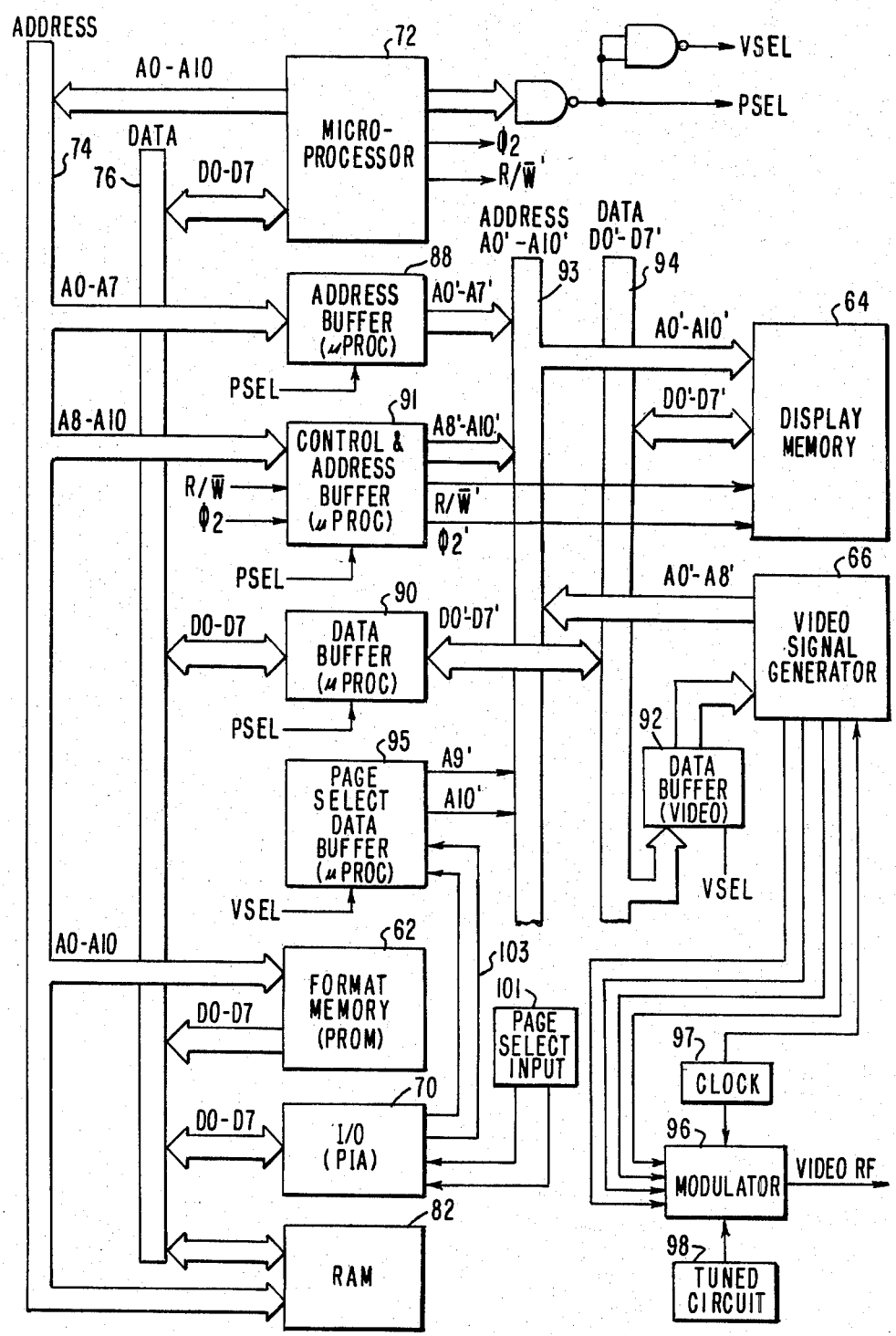
FIG. 5 is a detailed circuit diagram of a portion of the apparatus shown in FIG. 4.

A detailed circuit diagram of a portion of the load management terminal of FIG. 4 is shown in FIG. 5. As can be seen therein, the display memory 64 and video signal generator 66 are connected to the microprocessor 72 and to each other through a plurality of buffer devices 88, 90, 91, 92 and 95 to enable both the video signal generator 66 and the microprocessor 72 to access the display memory 64 without interference. Specifically, buffers 88 and 91 are connected both to the address bus 74 of the microprocessor containing address lines A0-A10 and to a similar 11-line display generator address bus 93 comprising lines A0'-A10'.

A data buffer 90 is connected to the 8-line data bus 76 of the microprocessor 72 containing lines D0-D7 and to a corresponding 8-line display generator data bus 94 comprising lines D0'-D7'.

The 11-lines A0'-A11' of the display generator address bus 93 are connected to the display memory 64. Nine of these lines, A0'-A8', are also connected to the video signal generator 66. Similarly, the 8 data lines D0'-D7' of the display generator data bus 94 are connected to the display memory 64 and to the video signal generator 66 through a video data buffer 92.

The buffer 91 also connects the control lines R/$\overline{W}$ and $\phi_2$ of the microprocessor 72 to the display memory 64, as well as additional address lines A8-A10 to the display generator address bus 93. A page select buffer 95 is also provided, as will be described below.

The buffers 88, 91, and 95 may comprise type 74LS244 devices, while buffers 90 and 92 may be type 74LS245 devices. Both device types are commercially available from the Texas Instruments Corporation. The buffers 88, 80, 91, 92, and 95 act as isolating devices, in that a low impedance path is established between each device input line and its corresponding output line whenever an activating terminal is connected to a logic zero signal. In the presence of a logic 1, i.e. a +5 volt signal, at the activating terminal, a high impedance path is established between each input line and its corresponding output line. In this manner, each of the buffers 88, 90, 91, 92, and 95 operates as an isolating switch under control of the corresponding activating terminal. The activating signals for the buffers are designated PSEL and VSEL (Processor Select and Video Select) and are produced by an array 81 of NAND gates under control of the microprocessor 72. The use of buffers is necessitated by the specific characteristics of devices selected for the display memory 64, microprocessor 72, and video signal generator 66. Other specific devices utilized to perform the functions of the microprocessor 72, display memory 64, and video signal generator 66 may not require the use of isolating buffers.

The format memory 62 may be a type ID2716 EPROM commercially available from INTEL Corporation. The EPROM 62 is connected to the microprocessors data (D0-D7) and address (A0-A10) busses which allows the microprocessor to read the memory and transfer the contents thereof into appropriate pages of the display memory 64.

The display memory 64 may be a type HM61162K random access memory commercially available from the Hitachi Corporation. The video signal generator is a type MC6847 device commercially available from the Motorola Corporation. As can be seen, the input to the video signal generator 66 comprises the 8-bit data bus D0'-D7' and the 11-bit address bus 94 containing A0'-A10'. As is described in the Applications Bulletin AN-822 published by the Motorola Corporation, the video signal generator 66 converts digital signals contained in a 512-location block of display memory 64 into a 16 line × 32 character standard composite color video signal containing luminance, chrominance, and synchronization data. The output lines of the video signal generator 66, are connected to the input of a radio frequency modulator 96 which may be a type MC1372 commercially available from the Motorola Corporation. In the manner described in the aforementioned Application Bulletin AN-822, a clock circuit 97 and tuned circuit 98 are also provided as inputs to the RF modulator 96. The clock circuit 97 acts to establish proper synchronization signals between the video signal generator 66 and RF modulator 96. The tuned circuit 98 establishes the frequency of the output signal of the RF modulator 96. This output signal comprises a 75 ohm RF signal modulated by the output of the video signal generator 66 to produce a standard NTSC color video signal on a standard home television channel determined by the tuned circuit 98. This output signal may be directly connected to the antenna terminal of a standard home television receiver to provide a video display on the screen thereof consisting of the alphanumeric or graphic representation of the contents of the status memory 30 of FIG. 2.

As was stated above, the video signal generator 66 utilizes a block of 512 locations of display memory 64 to provide a full screen of output data on a home television receiver. Since the display memory 64 contains 2,064 locations (i.e., 2K), the display memory 64 may contain four complete screens, or pages, of data to be displayed on the home television receiver.

The contents of the display memory 54 are supplied under control of the microprocessor 72 from portions of the status memory 30 which resides in random access memory 82 of FIG. 4. A first set of status data is transferred into a specific 512-location block of the 2064 location display memory 64, using Page Select lines 103 under control of the microprocessor 72 and PIA 70. The Page Select lines 103 are connected through buffer 95 to address lines A9' and A10'. Appropriate label data is also transferred into other locations of this same 512-byte block to form a first page, or screen, of display data. In similar manner, three additional full screens of status and label data may be transferred from the status data memory 30 of the RAM 82 and ROM 62 into the display memory 64. For example, page 1 may be the billing and metering display shown in FIG. 3. Other pages may include a message alert screen, a graphics display showing energy consumption data in bar chart form, and a spare page for future expansion. The selection of one of the four available pages of data from the display memory to be displayed upon the video display device or home television receiver is implemented by an electric utility customer operating a selector device 101 such as a rotary selector switch or series of push-button switches. The status of the device 101 is read by the microprocessor 72 through the PIA 70 at an appropriate time in the instruction execution sequence as will be indicated in the description thereof to follow.

FIG. 7 shows the structure of the data stored in the display memory 64. The eight-bit data byte labelled A in FIG. 7 represents the structure of data which will produce a display in the alphanumeric mode, indicated by a logic 0 in bit 7. Bit 6 of byte A, if blank, specifies that the alphanumeric character will be displayed in standard form, lighted against a black background. If bit 6 of byte A is a logic 1, the character will be displayed as inverted video; that is, the character will appear dark against a lighted background. Bit 5 through bit 0 contain the six-bit code for standard ASCII characters.

Byte B of FIG. 7 shows the structure of data for display in a graphic mode, indicated by a logic 1 in bit 7. Bits 6-4 contain chromanance data and specify one of eight possible colors. Bits 3-0 contain luminance data to indicate which quadrants will be lighted in the specified rectangular picture element on the 16 by 32 picture element matrix of the display screen, as shown at C of FIG. 7. The graphics mode may be utilized by providing data manipulation routines comprising microprocessor instructions stored in the ROM 80 of FIG. 4 to convert status data such as the metering data table into bar chart format for presentation on the video display device.

Figure 8A:
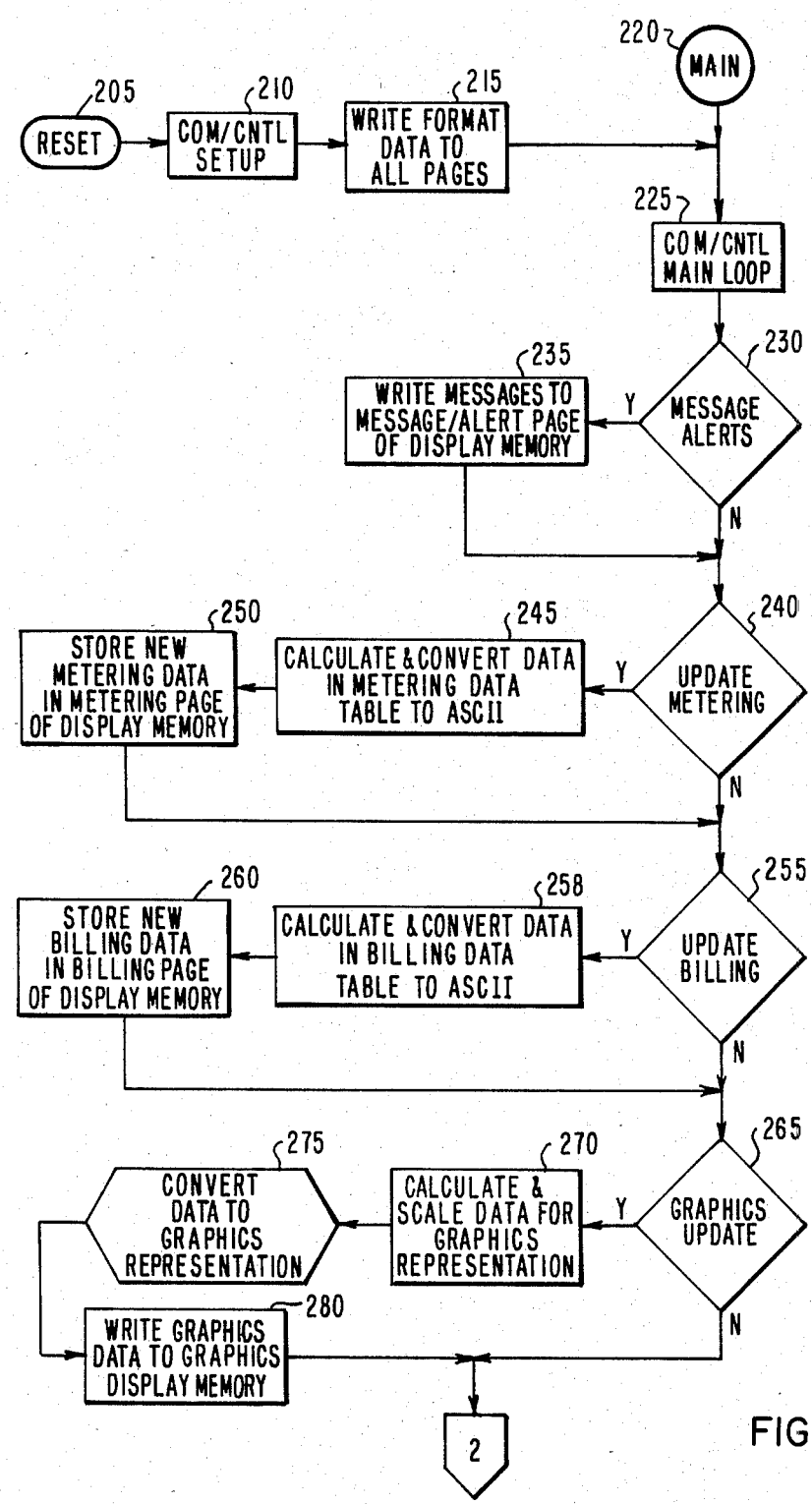
FIGS. 8A and 8B are flow charts of operating instructions stored in the read only memory of FIG. 4.
Figure 8B:
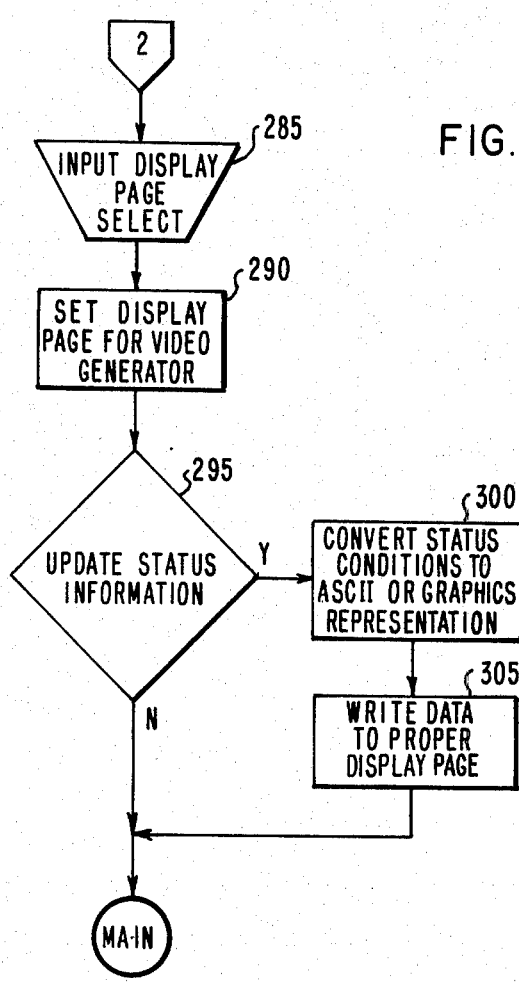

A flow chart describing the operating instructions stored in the read only memory 80 is shown in FIGS. 8A and 8B. Whenever the microprocessor 72 is first energized or is reset, execution of the operating instructions begins at the RESET junction 205. A series of initializing functions necessary for the operation of the communications and control functions of the terminal 10 is performed as is indicated at block 210. A more complete description of the communications and control functions of the terminal 10 is found in the aforementioned U.S. Pat. No. 4,130,874. As is indicated at 215, the labelling data from the format memory 62 is transferred to all pages of the display memory 64. Execution of program instruction then enters a main loop which is continuously executed by the terminal 10 whenever power is applied.

The communication and control functions of the load management terminal 10, described in the aforementioned U.S. Pat. No. 4,130,874, are now executed as indicated at 225. Following execution of these functions, a test is made at 230 to determine whether any messages or alerts have been received from the electric utility central station. If so, these messages are written at 235 to the message/alert page of the display memory 64.

A test is next made to determine if it is time to update data in the metering data table. If so, the raw data in the metering data table is transformed into the quantities to be displayed, and converted to ASCII format. The ASCII data is then transferred at 250 from the metering data table to the metering page of the display memory 64.

At 255, a test is made to determine if it is time to update the billing data. If so, the raw data in the billing data table is transformed into the quantities to be displayed, converted into ASCII format, and transferred at 260 from the billing data table to the billing page of the display memory 64.

A test is made at 265 to determine if it is time for graphics updates. If so, raw data from the status memory 30 is calculated and scaled at 270 and converted at 275 into the graphics data format previously described with reference to FIG. 7. This graphics data is then transferred from the RAM 82 to the graphics page of the display memory 64.

At 285 the microprocessor 72 reads the status of the page select device 101 to determine which of the four screens of display memory will be presented on the display device 38. The values obtained from the device 101 are then used at block 290 to cause the video signal generator 66 to produce a composite video signal from the selected page from the display memory 64.

A test is made at 295 to determine if it is time to update the load status information. If so, the data from the load status table 48 is converted to ASCII or graphics format and transferred at 305 to the proper page of the display memory 64. At this point, the data display functions have been completed and the program begins another iteration of the main loop beginning at junction 220.

Figure 6:
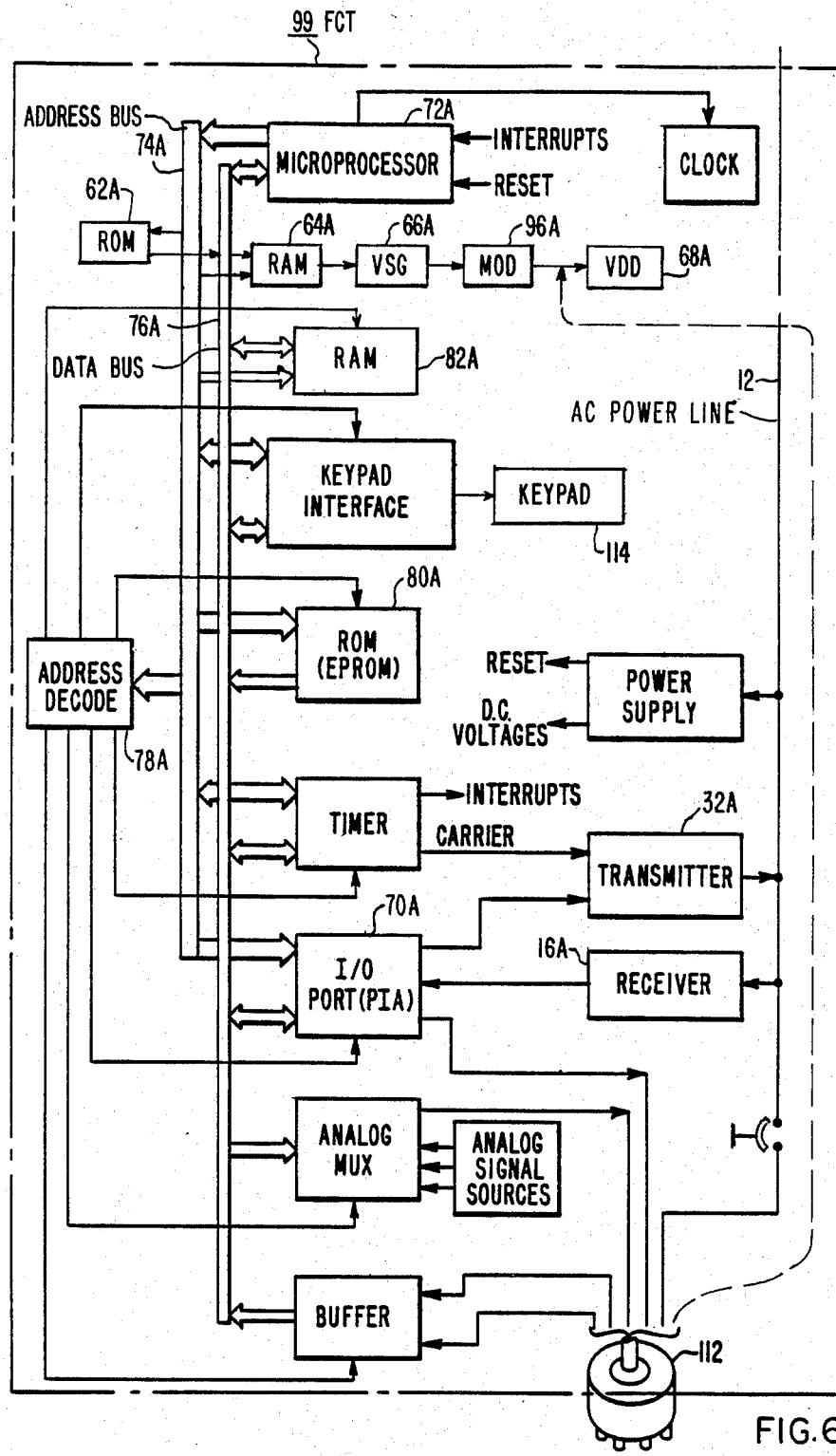
FIG. 6 is a structural block diagram showing a field configuration terminal employing the principles of the present invention.

An alternative embodiment of the present invention is shown in functional block diagram form in FIG. 6. This embodiment is a field configuration terminal (FCT) 99 for use in field testing and set-up of the load management terminal described in conjunction with FIG. 4. The operation of the FCT 99 of FIG. 6 is similar to that of the FCT described in the aforementioned patent application Ser. No. 363,218 (W.E. 50,362) and includes all functions and components thereof with the exception of the multisegment display. However, the embodiment of FIG. 6 also includes a display memory 64A, a video signal generator 66A, a format memory 62A and a video display device 68A in the manner described above with reference to the load management terminal embodiment of the present invention.

Briefly, the FCT 99 includes a plug 112 for removable insertion into a corresponding socket 113 of the load management terminal 10 of FIG. 4. The powerline 12 is connected to one terminal of the socket 113 and provides operating power for the FCT 99 through the plug 112. The FCT 99 acts as a portable testing and installation aid for the load management terminal 10. Any of a variety of tests described in the aforementioned patent application Ser. No. 363,218 (W.E. 50,362), can be initiated by operation of a keypad 114. This is detected by the microprocessor 72A of the FCT 99 which then generates an automated distribution command to direct the connected load management terminal under test to perform a specified action. This command is modulated onto a powerline carrier signal and is imposed on the powerline 12 by the FCT transmitter 32A.

The carrier signal containing the command message is received at the load management terminal 10 by the receiver 16 (FIG. 4), causing the terminal 10 to execute the command in the manner discussed above. A message confirming the execution of the received command is formulated by the terminal 10, modulated onto a carrier signal, and coupled to the powerline 12 by the transmitter 32 of the load management terminal. This message propagates over the powerline and is received by the receiver 16A of the FCT 99. The information content of the message is derived by the microprocessor 72A of the FCT 99 and stored in RAM 82A. It is then transferred to the display memory 64A of the FCT 99, converted to a composite video signal by a video signal generator 66A, and presented on the screen of the video display device 68A. along with appropriate labels describing the results of the test, which labels are stored in fixed digital form in the format ROM 62A of the FCT 99.

Alternatively, the FCT 99 may also include an RF modulator 96A connected between the video signal generator 66A and the video display device 38A, as shown in dashed lines in FIG. 6. The video display device 38A in this alternative embodiment contains an RF front end section such that the video display device 38A thereby comprises a television receiver capable of receiving an RF signal of a frequency identical to a standard television broadcast channel. The input of the FCT video display device 38A is connected to one contact of the plug 112 as shown by the dashed line of FIG. 6. The output of the RF modulator 96 of the connected LMT 10 is connected to a corresponding contact of the socket 113, shown by a dashed line in FIG. 4. When the load management terminal 10 executes a command transmitted by the FCT as a result of a test initiated through the keyboard 114, the results appear in the RAM 32 of the LMT. These results are transferred to the display memory 64 of the LMT 10 and are used to generate a composite video signal by the video signal generator 66 and a modulated RF signal by the modulator 96. This RF signal is sent through the socket 113 and plug 112 to the input of the FCT video display device 38A. The results of the test initiated by the FCT thus are presented on the video display device screen of the FCT.

In a preferred automated distribution system incorporating terminals embodying the present invention, an LMT located at each electric utility customer site includes a display memory 64, a video signal generator 66, and an RF modulator 96. The output of the modulator 96 is selectively connected to the customer's home television receiver to provide on demand a display of data relating to the customer's consumption of electric energy. Each FCT includes a video monitor having an RF front end to produce a video display from the RF output of the video signal generator of a connected LMT. Connections are made between the video display device 38 of the FCT 99 and the modulator 96 of the LMT under test. Test commands initiated from the keyboard 114 of the FCT 99 cause the contents of any desired location of memory of the LMT 10 to be transferred to the LMT display memory 64, modulated onto an RF' video signal by the generator 66 and modulator 96 and transmitted to the video display device 38A of the FCT 99. The FCT 99 can thus provide an operator with a display of any desired memory location of the LMT 10, thereby greatly facilitating the test and troubleshooting of a connected LMT.

As can be appreciated by those skilled in the art, the contents of any FCT memory device location connected to the microprocessor 72A may also be transferred into the FCT display memory 64A for subsequent display on the screen of a video display device 68A, in the manner described hereinabove. For example, the results of any tests performed by the field configuration terminal which appear either in the random access memory 82A or nonvolatile random access memory 84A may be transferred to the display memory 64A for subsequent display. Appropriate labels for these test results may be stored in a format memory 62A of FIG. 6, and transferred to the display memory 64A in appropriate locations to provide fixed format labels for the aforementioned test results. In this manner, a more meaningful data display is provided both to the electric utility customer and to the operator of a field configuration terminal, requiring less training for the operator and reducing the possibility of error due to misinterpretation of output data. Furthermore, the LMT need not include a video display device, thereby significantly decreasing the cost of the LMT.

We claim:

1. Remote terminal apparatus for use in an electric utility power line communications system for carrying control commands relating to the transmission and consumption of electric energy from a central station to a remote location, said apparatus comprising:
    receiving means at said remote location for deriving said control means;
    control means connected to said receiving means for executing control functions in response to said control commands;
    means connected to said control means for generating data representative of the status of said receiving means location;
    memory means connected to said status data generating means for storing said status data in a digital form;
    a display generator for generating a composite video signal corresponding to an alphanumeric representation of digital signals applied to an input thereof;
    means for coupling the input of said display generator to said memory means; and
    video display means coupled to said display generator for providing a visual display of said alphanumeric representation, whereby said status data is displayed to an operator at said receiving means location.

2. Apparatus as recited in claim 1 further comprising format storage means for storing digital format signals, said format storage means being connected to said display generator so that fixed alphanumeric formats labeling said status data are presented on said video display means simultaneously with said status data.

3. Apparatus as recited in claim 1 wherein said video display means is housed in a self-contained unit removably connected to the remainder of said apparatus.

4. Apparatus as recited in claim 1 wherein said apparatus is located at the site of an electric utility customer and further comprising means connected to the output of said display generator for generating a radio-frequency signal on the frequency of a standard television broadcast channel modulated with the output of said display generator; and
    means for selectively coupling the output of said radio frequency television signal generating means to the input of a standard home television receiver at said customer location;
    whereby said status data is displayed on the screen of said television receiver.

5. Apparatus as recited in claim 1 further comprising means coupled to said receiving means for generating signals containing automated distribution commands testing the operation of said apparatus, said test means comprising means coupled to said display generator for storing test format signals and for causing said test format signals to be displayed on said video display means in conjunction with said status data effected by the performance of said test commands, whereby the results of said test commands are presented on said video display means.

6. Apparatus as recited in claim 1 wherein said receiving means comprises means for receiving carrier signals with said control commands modulated thereon, and means for demodulating said carrier signals to recreate said control commands.

7. Apparatus as recited in claim 6 wherein said carrier signals are transmitted over an electric utility power line.

8. Apparatus as recited in claim 7 wherein said carrier signals have a frequency greater than the frequency of electrical energy also transmitted over said eledctric utility power line.

9. An automated distribution system load management terminal located at an electric utility customer location comprising:
  receiving means for receiving carrier signals modulated with automated distribution commands and for deriving said commands from said carrier signals, said carrier signals being transmitted by a central station that is operatively associated with said load management terminal by a power line;
  control means connected to said receiving means for executing said commands;
  memory means for storing digital data;
  metering means connected to said control means for measuring the consumption of electric energy at said customer location and for storing digital data representative of said consumption in said memory means in response to said commands;
  means connected to said memory means for generating video signals representative of digital data applied to the input of said generating means; and
  video display means connected to said generating means for providing a visual display of the digital data applied to the input of said generating means;
  whereby a visual display of information relating to the consumption of electrical energy is provided.

10. A load management terminal as recited in claim 9 further comprising radio frequency modulation means for providing a radio frequency signal on a standard broadcast television channel, said radio frequency signal being modulated by said video signals; and
  wherein said video display device comprises a standard broadcast television receiver at said customer location coupled to the output of said modulation means;
  whereby a visual display of information relating to the consumption of electrical energy at said customer location is presented on the screen of said television receiver.

11. A load management terminal as recited in claim 10 wherein said control means comprises a microprocessor, said memory means comprises a first random access memory device connected to said microprocessor for storing variable data relating to operations of said terminal, a second random access memory device connected to said microprocessor and to said video signal generating means, and a memory device containing digital data representative of format data for providing labels descriptive of said variable data;
  said microprocessor combining the contents of said first random access memory device and said format memory device into said second random access memory device;
  said video signal generating means being connected to said second random access memory device and providing a video signal representative of the contents of said second random access memory device;
  whereby a visual display of the alphanumeric representations of said data representative of said consumption is presented on said video display device in conjunction with alphanumeric legends identifying said consumption data.

12. A remote terminal for an electric utility automated distribution system for providing communication between a central station and a remote location, said terminal comprising:
  a receiving means for receiving carrier signals modulated with automated distribution commands and for deriving said commands from said carrier signals;
  digital processing means for executing said control commands and for generating digital data representative of the status of said remote location;
  memory means connected to said digital processing means for storing said digital data;
  means connected to said memory means for generating a composite video signal corresponding to digital data supplied to its input; and
  video display means connected to said video signal generating means for providing a visual display of the information contained in said composite video signal.

13. Apparatus for testing load management terminals of electric utility automated distribution system, comprising:
  input means for receiving operator actions to initiate a load management terminal test;
  processing means connected to said input means for generating automated distribution test commands in response to test initiating actions;
  transmitter means connected to said processing means for generating signals containing said test commands for an associated load management terminal under test;
  means for receiving automated distribution signals generated by an associated load management terminal in response to said test commands;
  memory means for storing data related to said operator actions and data contained in said received automated distribution signals;
  means connected to said memory means for generating a composite video signal representative of the contents of said memory means; and
  video display means connected to said video signal generating means for providing a visual display of the data carried by said composite video signal.

14. Apparatus as recited in claim 13 wherein said apparatus is removably connected to said associated load management terminal.

15. Electric utility automated distribution apparatus comprising:
  a load management terminal adapted to receive automated distribution commands from an electric utility central station, said load management terminal comprising digital processor means for performing control functions in response to said commands, memory means for storing status data relating to the execution of said commands, and means for generating a video signal representative of the contents of said memory means; and
  a test terminal comprising input means for receiving operator action to initiate a test of said load management terminal, transmitter means coupled to said load management terminal for generating automated distribution test command signals in response to said operator actions, means for coupling said video signal generator means to said test terminal, and a video display device connected to said coupling means for providing a visual display of the data contained in said video signal;
  whereby the contents of said load management terminal memory means are displayed by said video display device of said test terminal.

16. Apparatus as recited in claim 15 wherein said video signal generating means comprises modulator means for generating a radio frequency signal on a frequency of a standard broadcast television channel, and said video display device comprises means for receiving and demodulating said radio frequency signal.

17. Apparatus as recited in claim 16 further comprising means for coupling the output of said modulator means to the input of an electric utility customer's television receiver.

* * * * *